United States Patent
Verolet et al.

(10) Patent No.: US 11,670,912 B2
(45) Date of Patent: Jun. 6, 2023

(54) PHOTONIC CIRCUIT WITH HYBRID III-V ON SILICON ACTIVE SECTION WITH INVERTED SILICON TAPER

(71) Applicant: COMMISSARIAT À L'ÉNERGIE ATOMIQUE ET AUX ÉNERGIES ALTERNATIVES, Paris (FR)

(72) Inventors: Théo Verolet, Palaiseau (FR); Antonin Gallet, Paris (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 118 days.

(21) Appl. No.: 17/015,548

(22) Filed: Sep. 9, 2020

(65) Prior Publication Data
US 2021/0083456 A1 Mar. 18, 2021

(30) Foreign Application Priority Data
Sep. 12, 2019 (FR) ...................................... 1910101

(51) Int. Cl.
*H01S 5/10* (2021.01)
*H01S 5/20* (2006.01)
(Continued)

(52) U.S. Cl.
CPC ............ *H01S 5/2031* (2013.01); *H01S 5/021* (2013.01); *H01S 5/06258* (2013.01);
(Continued)

(58) Field of Classification Search
CPC ...... H01S 5/1064; H01S 5/1014; H01S 5/026; H01S 5/021; H01S 5/1032; H01S 5/06258; H01S 5/12; H01S 5/141; G02B 6/4296
See application file for complete search history.

(56) References Cited

U.S. PATENT DOCUMENTS 9,941,664 B1    4/2018  Hahn et al.
2015/0132002 A1 5/2015  Krishnamurthy et al.
(Continued)

FOREIGN PATENT DOCUMENTS

EP   3352312 A1        7/2018
WO   03102678 A1       12/2003
WO   WO-2020224994 A1 * 11/2020 ............. H01S 5/021

OTHER PUBLICATIONS

Search Report for French application No. 1910101 dated May 29, 2020.
(Continued)

*Primary Examiner* — Tod T Van Roy
*Assistant Examiner* — Delma R Fordé
(74) *Attorney, Agent, or Firm* — Pearne & Gordon LLP

(57) ABSTRACT

A photonic circuit with a hybrid III-V on silicon or silicon-germanium active section, that comprises an amplifying medium with a III-V heterostructure (1, QW, 2) and an optical wave guide. The wave guide comprises a coupling section (31) facing a central portion of the amplifying medium, a propagation section (34, 35) and a modal transition section (32, 33) arranged between the coupling section and the propagation section. In the modal transition section, the optical wave guide widens progressively from the propagation section towards the coupling section.

8 Claims, 5 Drawing Sheets

(51) Int. Cl.
*H01S 5/02* (2006.01)
*H01S 5/0625* (2006.01)

(52) U.S. Cl.
CPC .......... *H01S 5/1014* (2013.01); *H01S 5/1032* (2013.01); *H01S 5/2027* (2013.01)

(56) References Cited

U.S. PATENT DOCUMENTS

| | | |
|---|---|---|
| 2015/0207296 A1* | 7/2015 | Rickman ................ H01S 5/021 372/20 |
| 2016/0164246 A1* | 6/2016 | Rickman .............. G02B 6/1228 372/20 |
| 2017/0098922 A1 | 4/2017 | Hatori et al. |
| 2018/0212399 A1 | 7/2018 | Menezo et al. |
| 2019/0280461 A1* | 9/2019 | Menezo ................ H01S 5/1032 |
| 2020/0067274 A1* | 2/2020 | Kurczveil ................ H01S 5/50 |
| 2022/0050247 A1* | 2/2022 | Yu ........................ G02B 6/1228 |

OTHER PUBLICATIONS

Keyvaninia S. et al. "Heterogeneously integrated III-V/silicon distributed feedback lasers" In: Optics Letters, Optical Society of America, Dec. 15, 2013, Vil. 38, No. 24, pp. 5434-5437.

Fang et al. "A Distributed Bragg Reflector Silicon Evanescent Laser" In: IEEE Photonics Technology Letters, Oct. 15, 2008, vol. 20, No. 20, pp. 1667-1669.

\* cited by examiner

PHOTONIC CIRCUIT WITH HYBRID III-V ON SILICON ACTIVE SECTION WITH INVERTED SILICON TAPER

CROSS-REFERENCE TO RELATED APPLICATIONS

This application claims priority from French Patent Application No. 1910101 filed on Sep. 12, 2019. The content of this application is incorporated herein by reference in its entirety.

TECHNICAL FIELD

The field of the invention is integrated photonic circuits that use the properties of semiconducting materials capable of emitting light and of semiconducting materials classically used in microelectronics.

The invention relates to a photonic component with an hybrid III-V on silicon or silicon-germanium active section and applies more particularly to the design of modal transition zones between the hybrid active action and passive propagation sections made purely of silicon or silicon-germanium.

PRIOR ART

The technology of heterogeneous integration of III-V materials with silicon can be used to make optoelectronic components that integrate photonic circuits associating III-V optical sources with silicon-based components.

Heterogeneous III-V on silicon integration can in particular consist of bonding a portion of III-V active material capable of emitting light onto a "passive" circuit etched on the surface of a Silicon On Insulator (SOI) insulator. A photonic circuit with a hybrid III-V on silicon active section thus generally comprises:
- an SOI substrate supporting a silicon wave guide,
- a gain structure that comprises at least one optical amplifier medium with a III-V heterostructure, brought onto the SOI substrate by bonding,
- a thin oxide layer acting as a bond layer and that separates the gain structure from the silicon wave guide.

The III-V heterostructure is arranged to be subjacent to a section of the silicon wave guide to form a hybrid wave guide section with it. At this hybrid wave guide section, the vertical proximity of the III-V and silicon guides leads to the appearance of a coupled optical mode, derived from hybridation between the fundamental modes of each of the wave guides. This coupled mode must be transferred from the hybrid III-V/silicon active section to the passive light propagation sections made purely of silicon. The silicon wave guide is structured for this purpose, to have a modal transition section (taper) between the hybrid active section and the propagation sections. A taper according to prior art makes an adiabatic transition of the symmetric mode between two states by means of progressive narrowing of the silicon wave guide from a propagation section towards the hybrid active section.

Before bonding the portion of active III-V active material onto the SOI substrate, a thick oxide layer (of the order of a micrometre) is deposited on the silicon wave guide and Chemical Mechanical Planarisation (CMP) is done to thin the oxide layer to a target thickness equal for example to 80 nm. However, it is difficult to reach this target thickness at all points on an SOI substrate that can have a diameter of 200 mm, of even 300 mm. The thickness of the thin oxide layer thus includes disparities and can vary from 30 to 130 nm over the entire surface of the SOI substrate.

However, the properties of a taper according to prior art vary strongly as a function of the thickness of the oxide layer. As a result, to guarantee that the hybrid components have identical expected properties (for example an emission wavelength for a distributed feedback (DFB) laser), portions of the III-V active material are only bonded at specific locations of the SOI substrate, in fact at locations at which the measured oxide thickness corresponds to the target thickness. The result is that a large part of the SOI substrate (for example up to 60% of its surface area) is not used, leading to an additional cost.

PRESENTATION OF THE INVENTION

The purpose of the invention is to disclose a modal transition structure that is less sensitive to the manufacturing conditions of a photonic circuit with a hybrid III-V on silicon or silicon-germanium active section. It is aimed more particularly at solving problems associated with non-uniformity of the oxide layer separating the III-V material from the silicon or silicon-germanium wave guide to enable more advanced industrialization of the III-V on silicon or silicon-germanium laser sources.

To achieve this, the invention discloses a photonic circuit comprising an amplifying medium with a III-V heterostructure and an optical wave guide locally facing the amplifying medium at an overlap zone. The optical wave guide comprises a coupling section facing a central portion of the amplifying medium, a propagation section outside the overlap zone and a modal transition section arranged between the coupling section and the propagation section at one end of the overlap zone. The modal transition section of the optical wave guide widens progressively over its entire length from the propagation section to the coupling section.

Some preferred but non-limitative aspects of this photonic circuit are as follows:
 the modal transition section is conformed to achieve coupling of the antisymmetric mode between the propagation section and the coupling section;
 the amplifying medium comprises a transition section, the width of which reduces from said central portion towards the propagation section;
 it also comprises an optical feedback structure that forms a resonant cavity for the amplifying medium;
 the optical feedback structure is composed of a distributed reflector formed in the coupling section;
 the optical feedback structure comprises a reflector located in the propagation section;
 the optical feedback structure is a ring; —the optical wave guide is made of silicon or silicon-germanium.

BRIEF DESCRIPTION OF THE DRAWINGS

Other aspects, purposes, advantages and characteristics of the invention will be better understood after reading the detailed description given below of preferred embodiments of the invention, given as non-limitative examples, with reference to the appended drawings on which.

DETAILED DESCRIPTION

Figure 1:
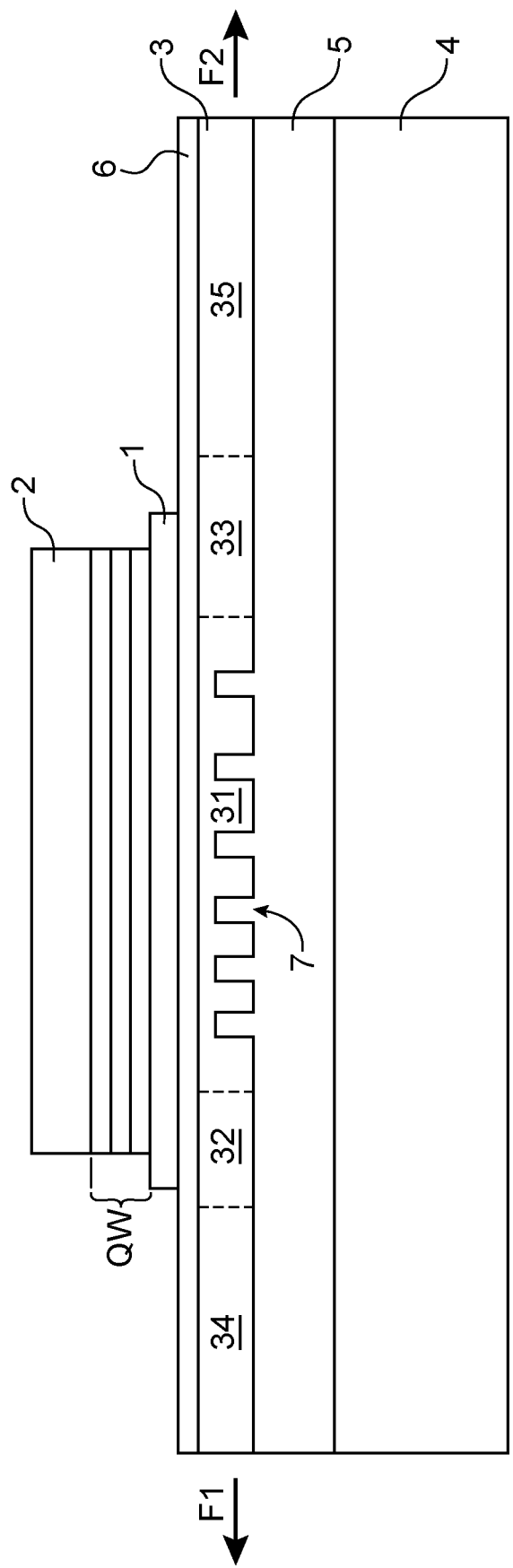
FIG. 1 is a longitudinal sectional view of a photonic circuit with a hybrid III-V on silicon active section in this case forming a DFB laser.

FIG. 1 represents a longitudinal sectional view of a photonic circuit with a hybrid III-V on silicon active section according to the invention, in this case forming a DFB laser. This DFB laser comprises an amplifying medium with III-V heterostructure. Type III-V heterostructure means the use of materials that can be chosen from the following non exhaustive list: InP, GaAs, InGaAlAs, InGaAsP, AlGaAs, InAsP. The heterostructure of such an amplifying medium, also called a gain medium, may comprise a stack of various layers, for example such as a stack of layers forming quantum wells sandwiched between a first doped layer, preferably N-doped, and a second doped layer, preferably P-doped. Such an amplifying medium can thus comprise a stack QW of quantum wells sandwiched between an N-doped InP layer 1 and a P-doped InP layer 2. The thickness of the sandwich composed of the layers 1 and 2 and the stack of quantum wells QW is typically between 1 and 3 μm.

The amplifying medium with a III-V heterostructure is added onto an SOI substrate that comprises a superficial layer 3 separated from a solid silicon substrate 4 by a buried oxide layer 5. An optical guide is structured in the superficial layer 3 and a bonding layer made of an oxide 6 separates the amplifying medium from the wave guide. The superficial layer 3 can be made of silicon or silicon-germanium, and therefore the terms silicon wave guide or silicon-germanium wave guide are used. In the following, we will consider the example of a silicon wave guide, it being understood that the presentation can perfectly well be transposed to a silicon-germanium wave guide.

As shown on FIG. 1, the wave guide, made of silicon in the example, is locally facing the amplifying medium at an overlap zone. More particularly, the optical wave guide comprises a coupling section 31 facing a central portion of the amplifying medium, two modal transition sections 32, 33 arranged on each side of the coupling section 31 at one end of the overlap zone (each thus being located facing one end of the amplifying medium) and, outside the overlap zone, two propagation sections 34, 35, each optically coupled to one of the modal transition sections 32, 33 and not covered by the amplifying medium.

A Bragg grating 7 is formed in the coupling section 41 to supply optical feedback to form a resonant cavity for the amplifying medium. Light emitted from the laser cavity is thus coupled with the silicon guide and propagates at the output along arrows F1 and F2 from each of the propagation sections 34, 35.

Figure 2:
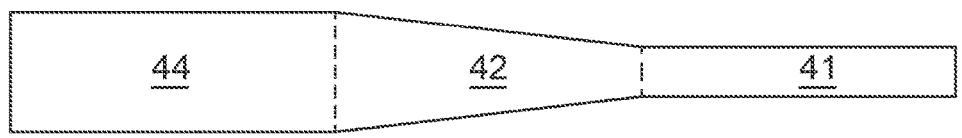
FIG. 2 is a top view of a modal transition section according to prior art that couples the symmetric mode between the passive silicon guide and the active III-V guide.

FIG. 2 shows a modal transition section 42 according to prior art that couples the symmetric optical mode between the passive silicon guide and the active III-V guide. This modal transition section 42 narrows transversely to the light propagation direction, from a passive light propagation section made of silicon 44 towards a coupling section 41 with the III-V amplifying medium. In other words, this transition section 42 is made by reducing the width of the silicon guide from the passive section 44 towards the hybrid active section 41.

Figure 3:
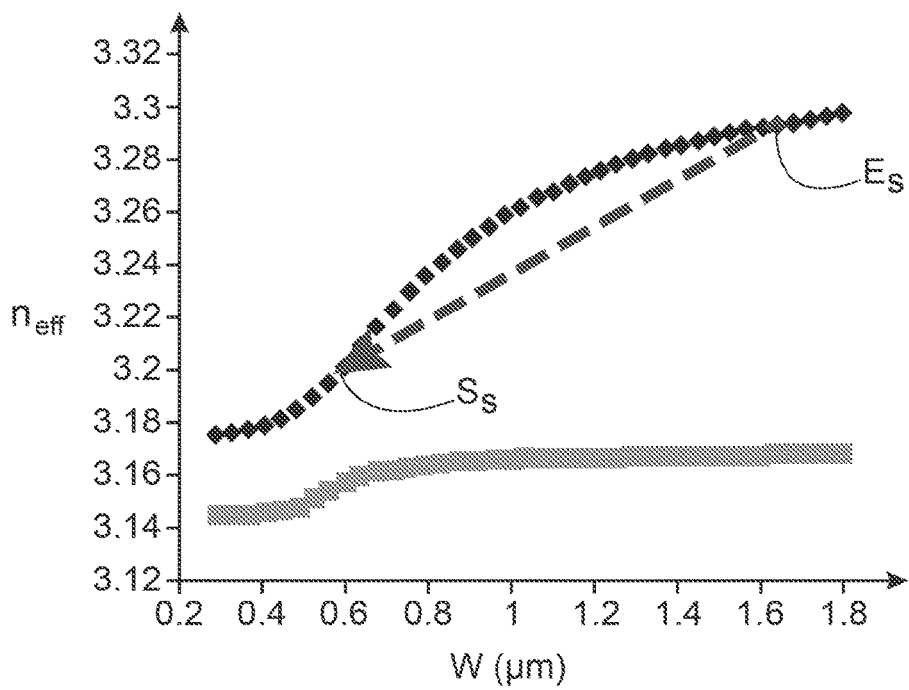
FIG. 3 illustrates the variation of the effective index within the modal transition section in FIG. 2.
Figure 4:
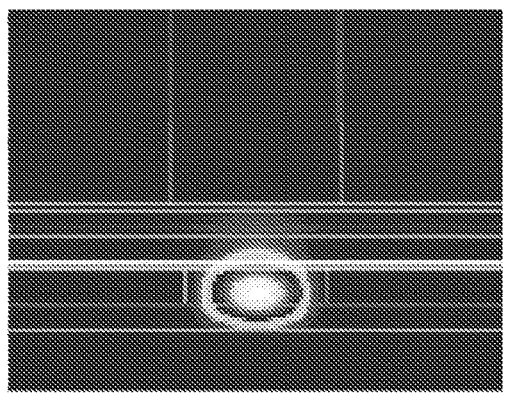
FIG. 4 represents the confinement of the symmetric optical mode in the passive silicon guide.
Figure 5:
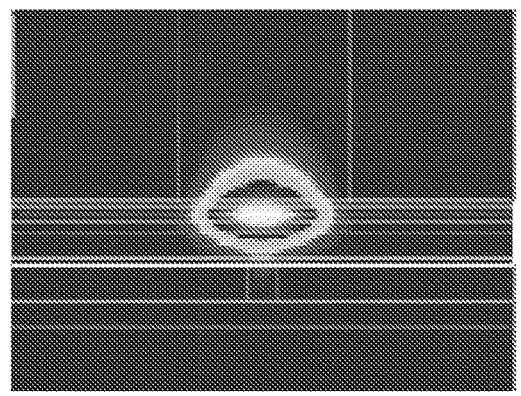
FIG. 5 represents the confinement of the symmetric optical mode in the active III-V guide.

FIG. 3 illustrates the effective index $n_{eff}$ of the symmetric mode as a function of the width W (in nm) of a silicon wave guide transversely to the direction of light propagation. This FIG. 3 explains the reduction of the effective index $n_{eff}$ within the modal transition section 42 in FIG. 2 from an input Es on the side of the propagation section 44 to an output Ss on the side of the coupling section 41. This reduction changes from a confinement of the symmetric optical mode principally in the propagation section 44 of the silicon passive guide as shown on FIG. 4 to a confinement of the symmetric optical mode principally in the active III-V guide as shown on FIG. 5.

Figure 6:
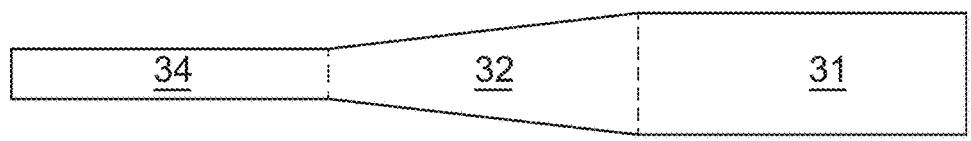
FIG. 6 is a top view of a modal transition section according to the invention that couples the antisymmetric mode between the passive silicon guide and the active III-V guide.

Unlike such a modal transition section according to prior art, the invention recommends coupling the antisymmetric mode between the passive silicon guide and the active III-V guide by means of a modal transition section that makes an adiabatic transition of the antisymmetric mode between two states. FIG. 6 shows such a modal transition section 32 according to the invention. As represented, it widens, transversely to the light propagation direction, over its entire length (along the light propagation direction) from a passive light propagation section made of silicon 34 towards the coupling section 31 with the III-V amplifying medium. In other words, this transition section 32 is made by increasing the width of the silicon guide over its entire length from the passive section 34 towards the hybrid active section 31. For example, the initial width of the transition section 32 (at the side of the passive section 34) is between 300 nm and 600 nm, and preferably 400 nm, and the final width of the transition section 32 (at the side of the coupling section 31) is between 1 μm and 2 μm, and preferably 1.5 μm. The length of the transition section 32 can be between 50 μm and 300 μm, and preferably between 100 μm and 200 μm, for example 150 μm. Widening of the wave guide in the transition section from the passive section 34 to the hybrid active section 31 follows a profile enabling an optimal adiabatic transformation of the asymmetric mode. For example, this profile may be of the arc tangent type.

Figure 7:
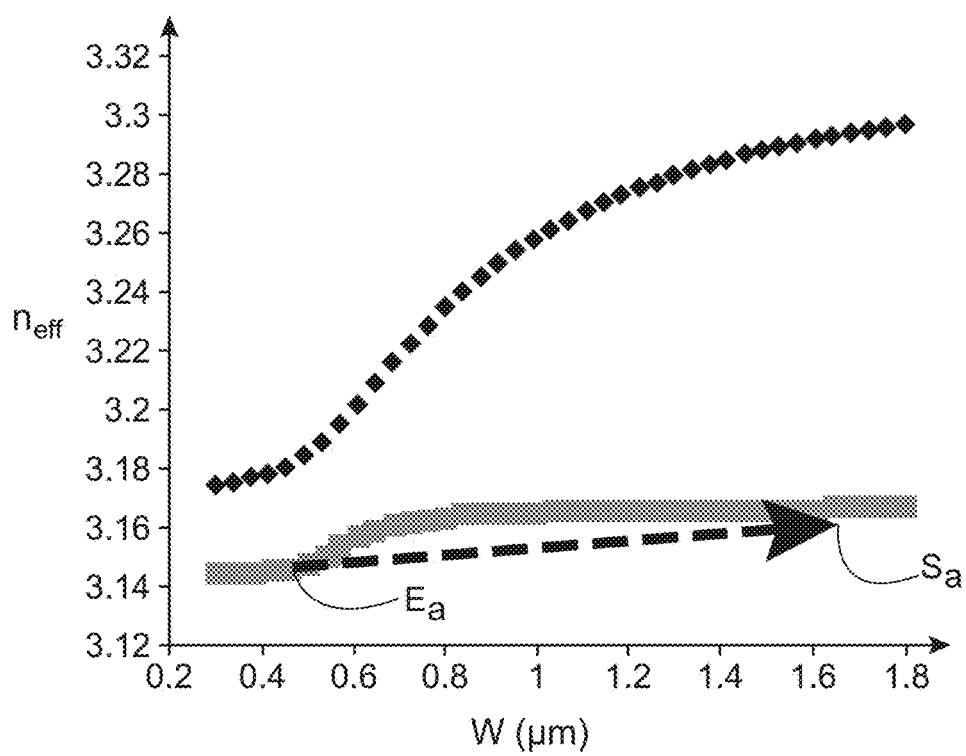
FIG. 7 illustrates the variation of the effective index within the modal transition section in FIG. 6.
Figure 8:
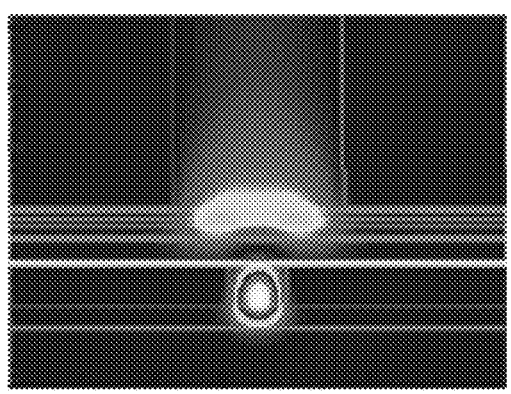
FIG. 8 represents the confinement of the antisymmetric optical mode in the passive silicon guide.
Figure 9:
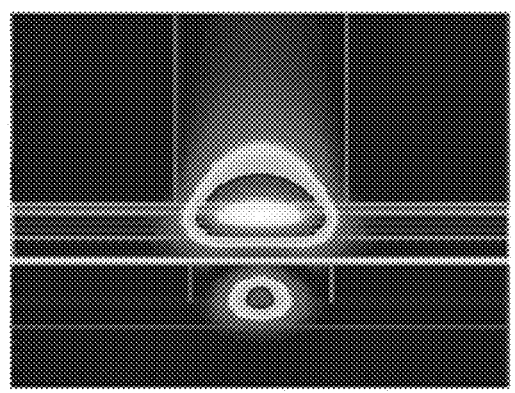
FIG. 9 represents the confinement of the antisymmetric optical mode in the active III-V guide.

FIG. 7 illustrates the effective index $n_{eff}$ of the antisymmetric mode as a function of the width W (in nm) of a silicon wave guide transversely to the direction of light propagation. This FIG. 7 explains the increase of the effective index $n_{eff}$ within the modal transition section 32 according to the invention from an input Ea on the side of the propagation section 44 to an output Sa on the side of the coupling section 41. This increase makes it possible to change from a confinement of the antisymmetric optical mode principally in the propagation section 34 of the silicon guide as shown on FIG. 8 to a confinement of the antisymmetric optical mode principally in the III-V active guide as shown on FIG. 9. The antisymmetric optical mode can be confined in the propagation section 34 particularly by assuring that the width of the silicon wave guide in this section 34 is less than 400 nm. Widening of the silicon guide in the modal transition section 32 can progressively transfer light to the III-V medium.

The antisymmetric mode has the advantage of being significantly more robust than the symmetric mode to variations in the thickness of the oxide layer 6 acting as a connection between the III-V and the Si. Thus, disparities of between 30 and 130 nm in this thickness on a 200 mm diameter substrate are significantly less harmful at a modal transition section according to the invention. Since the properties of these sections are crucial for making III-V on silicon or silicon-germanium laser sources, such sources using a circuit according to the invention are also much more robust to variations in the thickness of the bonding layer 6 and therefore the efficiency of these sources is increased.

Robustness of the antisymmetric mode to variations in the thickness of the oxide layer 6 was studied by examining the different properties of this mode: its confinement factor, its effective index, the coupling force of the Bragg grating of a DFB laser and operation of the DFB laser at high temperature.

Figure 10:
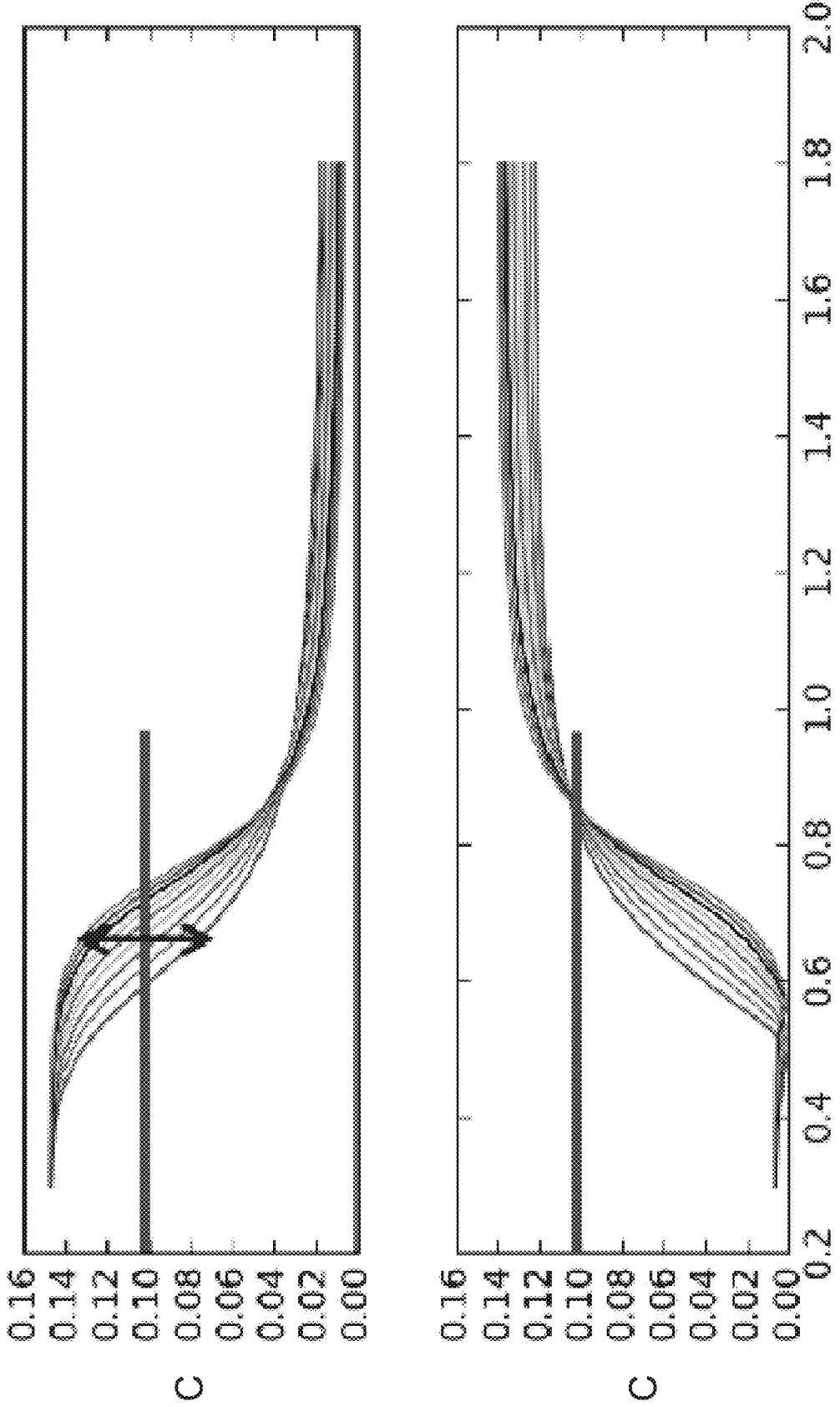
FIG. 10 represents the variation of the confinement ratio of each of the symmetric and antisymmetric modes inside the amplifying medium for different oxide thicknesses, as a function of the width of the silicon wave guide.

FIG. 10 thus represents the variation of the confinement ratio C for the symmetric mode (at the top on FIG. 10) and for the antisymmetric mode (at the bottom on FIG. 10) as a function of the width W (in nm) of the silicon wave guide in the coupling section 31, for different thicknesses of the oxide layer (from 30 nm to 130 nm). It is found that for a 10% value classically required for confinement, there is no variation in confinement of the antisymmetric mode as a function of the thickness of the oxide layer, whereas confinement of the symmetric mode varies between 6% and 14% as a function of the thickness of the oxide layer.

Figure 11:
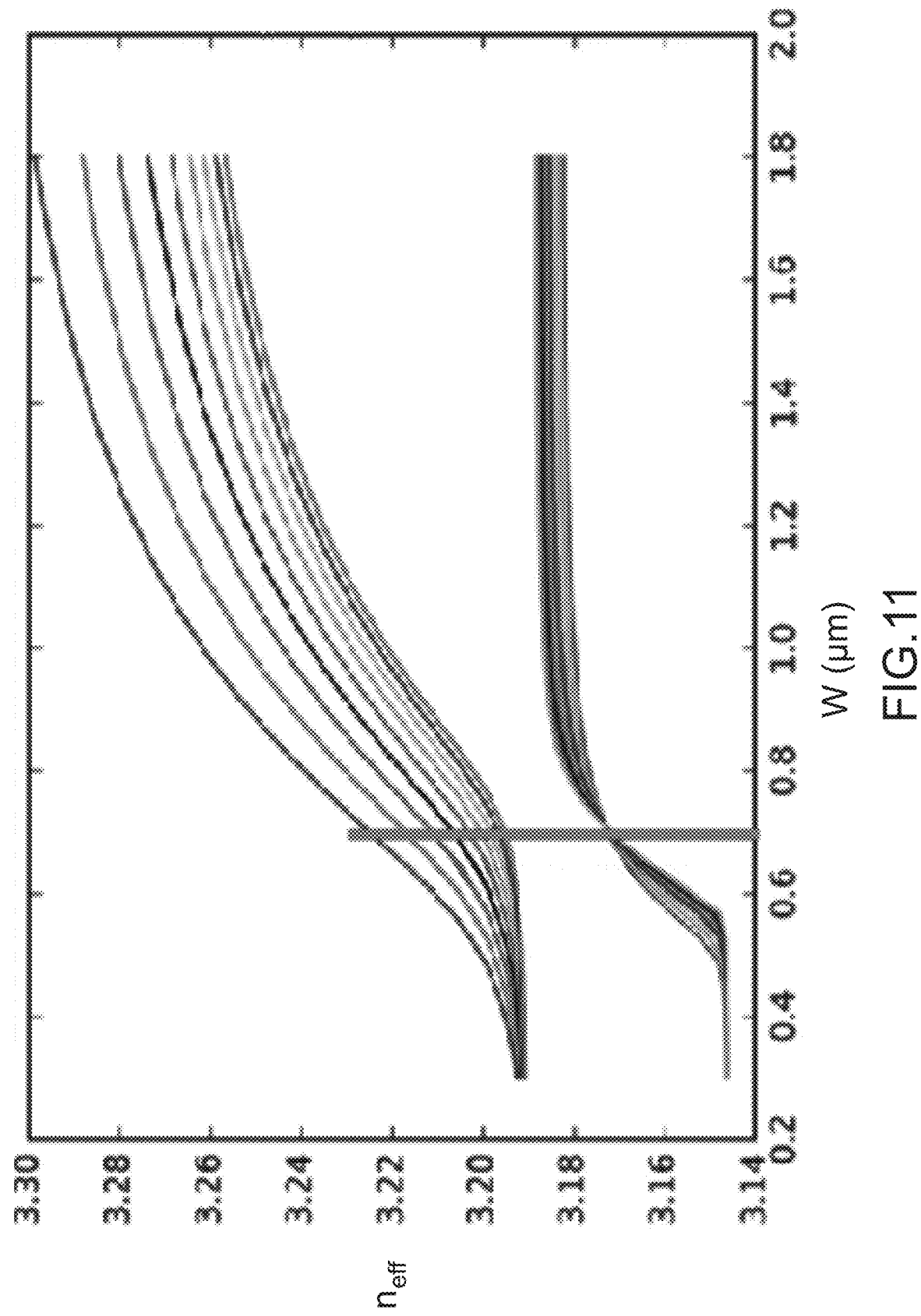
FIG. 11 represents the variation of the effective index of each of the symmetric and antisymmetric modes for different oxide thicknesses, as a function of the width of the silicon wave guide.

FIG. 11 represents the variation of the effective index $n_{eff}$ for the symmetric mode (at the top on FIG. 11) and for the antisymmetric mode (at the bottom on FIG. 11) as a function of the width W (in nm) of the silicon wave guide in the coupling section 31, for different thicknesses of the oxide layer (from 30 nm to 130 nm). It is found that the effective index of the asymmetric mode is significantly more robust to variations in the thickness of the oxide layer than that of the symmetric mode. For example, for a width of the silicon guide equal to 0.7 µm, this index can vary between 3.195 and 3.220 for the symmetric mode while it is invariable for the antisymmetric mode. The emission wavelength of a laser made according to the invention is then robust to variations in the thickness of the oxide layer.

In a DFB laser, the coupling force of the Bragg grating formed in the coupling section 31 is strongly affected by the thickness of the oxide layer 6 in the case of propagation of the symmetric mode. On the other hand, this is not the case for propagation of the antisymmetric mode.

It shall also be noted that since the effective index of the antisymmetric mode is less than that of the symmetric mode, a DFB laser making use of the asymmetric mode emits at a shorter wavelength than a DFB laser making use of the symmetric mode. To obtain correct operation of the laser at high temperature, the emission wavelength has to be shifted towards the photoluminescence peak of the III-V gain material. In this case, a DFB laser making use of the symmetric mode and for which the emission wave is thus shifted moves to correspond to the maximum of the gain medium. The Side Mode Suppression Ratio (SMSR) of such a laser is then low.

On the other hand, the emission wavelength of a DFB laser making use of the asymmetric mode and for which the emission wave length is thus offset will no longer correspond with the gain medium. The SMSR ratio is thus improved. Therefore the DFB laser making use of the antisymmetric mode is less sensitive to temperature variations than a DFB laser making use of the symmetric mode.

We have seen above that the photonic circuit according to the invention can make use of an optical feedback structure making it possible to form a resonant cavity for the amplifying medium. As previously described, this feedback structure is composed of a distributed reflector formed in the coupling section in the case of a DFB laser. The invention generally extends to include any laser source with III-V semiconductors, for example such as sources that use a reflector as the feedback structure, located in each of the propagation sections 34, 35 (thus forming a Distributed Bragg Reflector (DBR)) or a ring.

In one possible embodiment of the invention, the amplifying medium with a III-V heterostructure also comprises transition sections on each side of the central portion of the amplifying medium, these transition sections principally being intended to avoid parasite reflections. In such a transition section, the width of the amplifying medium can progressively be reduced from said central portion towards propagation sections 34, 35 of the silicon guide, possibly in the form of a tapered tip. Alternatively, this transition section can be in the form of a curve with losses.

The invention claimed is:

1. A photonic circuit, comprising:
   an amplifying medium with III-V heterostructure,
   an optical wave guide locally facing the amplifying medium at an overlap zone, the optical wave guide comprising a coupling section facing a central portion of the amplifying medium, a propagation section outside the overlap zone, and a modal transition section arranged between the coupling section and the propagation section and at least partially inside the overlap zone,
   wherein the modal transition section of the optical wave guide continuously widens over its entire length from a first width of the propagation section outside the overlap zone to a second width of the coupling section inside the overlap zone, the second width being greater than the first width, and
   wherein the modal transition section is conformed to achieve coupling of an antisymmetric mode between the propagation section and the coupling section.

2. The photonic circuit according to claim 1, wherein the amplifying medium comprises a transition section, the width of which reduces from said central portion towards the propagation section.

3. The photonic circuit according to claim 1, also comprising an optical feedback structure configured to form a resonant cavity for the amplifying medium.

4. The photonic circuit according to claim 3, wherein the optical feedback structure comprises a distributed reflector formed in the coupling section.

5. The photonic circuit according to claim 3, wherein the optical feedback structure comprises a reflector located in the propagation section.

6. The photonic circuit according to claim 3, wherein the optical feedback structure is a ring.

7. The photonic circuit according to claim 1, wherein the optical wave guide is made of silicon or silicon-germanium.

8. A photonic circuit, comprising:
   an amplifying medium with III-V heterostructure, an optical wave guide locally facing the amplifying medium at an overlap zone, the optical wave guide comprising a coupling section facing a central portion of the amplifying medium, a propagation section outside the overlap zone, and a modal transition section arranged between the coupling section and the propagation section and at least partially inside the overlap zone, wherein the modal transition section of the optical wave guide continuously widens over its entire length from a first width of the propagation section outside the overlap zone to a second width of the coupling section inside the overlap zone, the second width being greater than the first width, wherein the modal transition section is conformed to achieve coupling of an antisymmetric mode between the propagation section and the coupling section, and wherein the modal transition section has a profile corresponding to an arc tangent curve.

\* \* \* \* \*